United States Patent
Chen

(10) Patent No.: US 6,885,559 B2
(45) Date of Patent: Apr. 26, 2005

(54) ELECTROSTATIC DISCHARGE PROTECTION COVER

(75) Inventor: Cheng-Che Chen, Taoyuan Hsien (TW)

(73) Assignee: Quanta Computer Inc. (TW)

( * ) Notice: Subject to any disclaimer, the term of this patent is extended or adjusted under 35 U.S.C. 154(b) by 19 days.

(21) Appl. No.: 10/303,775

(22) Filed: Nov. 26, 2002

(65) Prior Publication Data

US 2004/0052018 A1 Mar. 18, 2004

(30) Foreign Application Priority Data

Sep. 13, 2002 (TW) .................................. 91214520 U

(51) Int. Cl.[7] .......................... H05K 5/00; H05K 5/04; H05K 5/06; H05K 7/14; H05K 7/18
(52) U.S. Cl. .................. 361/753; 361/799; 361/212; 361/220; 439/181; 439/607
(58) Field of Search ............................. 439/181, 607; 361/212, 220, 753, 799, 800, 816, 818; 174/35 R, 35 GC

(56) References Cited

U.S. PATENT DOCUMENTS 5,470,259 A * 11/1995 Kaufman et al. ........... 439/607
5,795,190 A * 8/1998 Ono ........................... 439/607

FOREIGN PATENT DOCUMENTS

TW 229850 9/1994

* cited by examiner

Primary Examiner—Phuong T. Vu

(57) ABSTRACT

An electrostatic discharge protection cover is described. The electrostatic discharge protection cover enhances the strength of an upper cover of a PC card socket and protects the socket from electrostatic discharge pulse. The electrostatic discharge protection cover has a protection plate assembled on a PC card socket upper side for guiding the pulse of electrostatic discharge to a ground, and a stair-type enhancing edge to enhance the strength of the protection plate. The stair-type enhancing edge further couples with a metal crossbeam of a computer to enhance the strength and electrostatic discharge protection capacity.

2 Claims, 3 Drawing Sheets

ELECTROSTATIC DISCHARGE PROTECTION COVER

FIELD OF THE INVENTION

The present invention relates to a personal computer card socket and especially to an electrostatic discharge protection cover of a personal computer card socket.

BACKGROUND OF THE INVENTION

PCMCIA (Personal Computer Memory Card International Association) is an international standards body and trade association that was founded in 1989 to establish standards for Integrated Circuit cards and to promote interchangeability among mobile computers where ruggedness, low power, and small size were critical. A card developed according to PCMCIA standards is called a personal computer (PC) card. The size of the PC card is similar to a credit card. The PC Card Standard defines a 68-pin interface between the peripheral card and the socket into which it is inserted. In addition to electrical and physical specifications, the PC Card Standard defines a software architecture to provide "plug and play" capability across the widest range of products. The PC card enhances computer functions such as extended memory size, network connection capacity and so on. The personal computer, and especially a notebook computer, utilizes the PC card to extend functions thereof. The notebook computer has a limited space; therefore the PC card can increase the extension capability of the notebook computer. Hence, the PC card is a standard device for the notebook computer.

When electronic parts are more precise, the electrical circuit is more sensitive to electrostatic discharge (ESD). Therefore, ESD protection is more important. Normally, the ESD current is exhausted to an electrical circuit coupling with a system ground to avoid damaging internal electrical elements when a device receives an ESD pulse.

FIG. 1 is a schematic view of a traditional PC card socket. The traditional PC card socket 100 is installed behind a crossbeam 130. The ESD protection cover 110 and the rear ESD protection cover 140 protect the PC card socket 100 from ESD pulses to reduce damage to the PC card socket 100 and the electronic parts therein. The ESD protection covers are made of a metal sheet. Therefore, the ESD protection cover can be deformed by an accidental external force when the cover is delivered or the cover is assembled. The ESD protection cover 110 may be deformed to form a concave position 120. As the drawing shows, the concave position 120 can cause interference as the PC card is inserted into the entrance 150 of the PC card socket 100. When the condition is more serious, the PC card cannot be inserted into the entrance 150 of the PC card socket 100.

Therefore, there is a need to provide an ESD protection cover that can enhance the strength thereof and does not influence the assembly process so as to use the PC card more safe and easy.

SUMMARY OF THE INVENTION

One object of the present invention is to utilize an extended enhancing edge to increase the bending strength of an ESD protection cover of a PC card socket.

Another object of the present invention is to utilize an extended enhancing edge combined with a crossbeam of a computer to further increase the bending strength of an ESD protection cover of a PC card socket.

A further object of the present invention is to utilize an extended enhancing edge combined with a metal crossbeam of a computer to further increase the ESD protection capability of the PC card socket.

The present invention provides an electrostatic discharge protection cover for a personal computer card socket. The electrostatic discharge protection cover is an upper cover of the personal computer card socket. The electrostatic discharge protection cover has a capability of leading electrostatic discharge pulse to a ground circuit of a computer. The electrostatic discharge protection cover comprises an electrostatic discharge protection plate and an extended enhancing edge. The electrostatic discharge protection plate is installed on the personal computer card socket and connects with the ground circuit of the computer to lead the electrostatic discharge pulse to the ground circuit. The extended enhancing edge connects with the electrostatic discharge protection plate to enhance a bending strength of the electrostatic discharge protection plate. The extended enhancing edge comprises a stair-type enhancing edge.

The computer further comprises a crossbeam to enhance the computer structure and the crossbeam further combines with the extended enhancing edge to enhance further the bending strength. When the crossbeam is made of metal material and connects with the ground circuit of the computer, the electrostatic discharge protection capability of the electrostatic discharge protection cover further increases.

Hence, the electrostatic discharge protection cover according to the present invention simplifies the assembly process without any harmful influence and enhances the structure strength thereof, therefore the PC card can be use more safely and easily.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
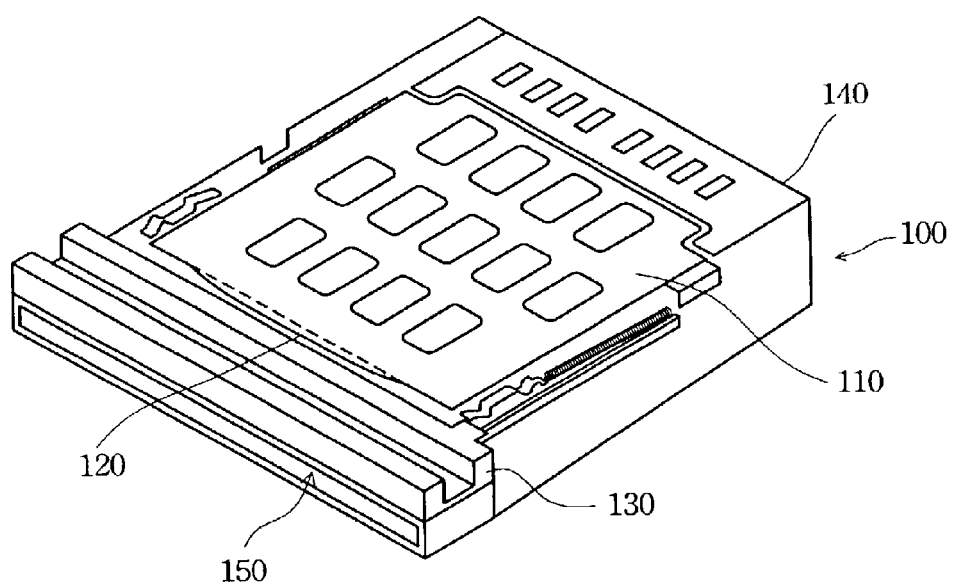
FIG. 1 is a schematic view of a traditional PC card socket.
Figure 2:
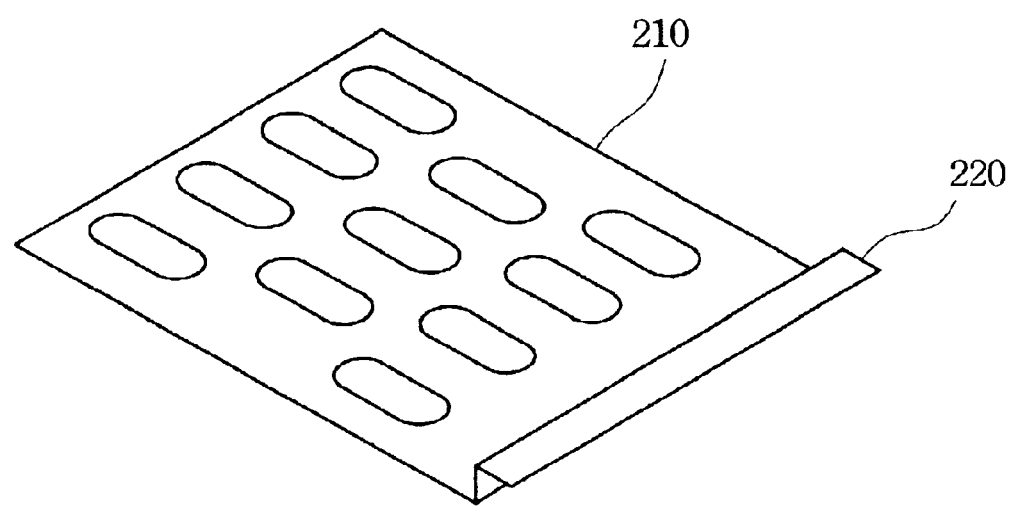
FIG. 2 is a preferred embodiment of a electrostatic protection cover of the PC card socket.

FIG. 2 is a preferred embodiment of an electrostatic protection cover of the PC card socket. The ESD protection cover 210 according to the present invention includes an extended enhancing edge, such as a stair-type enhancing edge 220. The stair-type enhancing edge 220 is formed by bending the edge upward about 90 degrees and then forward about 90 degrees. The shape of the extended enhancing edge can be further modified according to the shape of the matching element, and is not limited to the stair-type enhancing edge 220. The stair-type enhancing edge 220 is a preferred embodiment to match the profile of the crossbeam 130. The extended enhancing edge increases the bending strength of the ESD protection cover 210. The ESD protection cover 210 connects with a ground circuit of the computer, and therefore the ESD protection cover 210 can lead the ESD pulse directly to the ground circuit to protect the PC card and the socket from the ESD damage.

Figure 3:
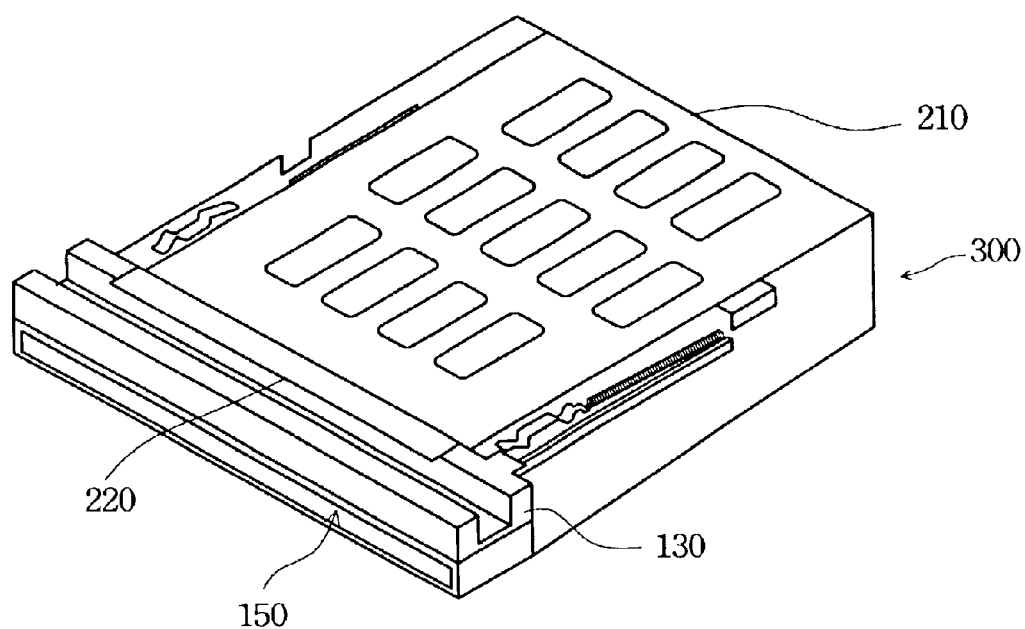
FIG. 3 is a schematic view of the electrostatic protection cover of FIG. 2 installed on a PC card socket.

FIG. 3 is a schematic view of the electrostatic protection cover of FIG. 2 installed on a PC card socket. When the PC card socket with the ESD protection cover 210 according to the present invention is installed on the computer, the stair-type enhancing edge 220 couples with the crossbeam 130. Due to the coupling with the crossbeam 130, the bending strength of the ESD protection cover 210 further increases. Therefore, when a notebook computer utilizes the PC card socket with the ESD protection cover 210, the ESD protection cover 210 has a high bending strength to protect the edge from deformation, such as a concave deformation. Accordingly, the PC card is easily inserted into the PC card socket without any interference. Furthermore, as the crossbeam 130 is made of a metal material and connects with the ground circuit of the computer, the ESD pulse on the ESD protection cover 210 can further lead to the ground circuit of the computer by way of the crossbeam 130. The ESD protection cover 210 connects with the ground circuit of the computer not only directly but also by way of the stair-type enhancing edge 220 and the crossbeam 130. Therefore, the ESD protection capability of the PC card socket is further increased.

The ESD protection cover 210 further combines the rear and front ESD protection cover of the traditional covers of a PC card socket. The assembly process of the protection cover is thus further simplified. Therefore, the working time and the cost of the assembly process are further reduced.

Due to the limited space in a notebook computer, the PC card will enjoy more widespread use in notebook computers to extend performances thereof. The PC card socket with the ESD protection cover according to the present invention further increases the bending strength, simplifies the assembly process, and provides a safety and stable working device. Furthermore, if the crossbeam coupling with the ESD protection cover is made of metal material and connects with the ground of the notebook computer, the ESD protection capability will be enhanced. The ESD protection cover according to the present invention further provides a safer and more stable PC card socket for a notebook computer.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. An electrostatic discharge protection cover for an upper cover of a personal computer card socket, the electrostatic discharge protection cover having a capability of leading electrostatic discharge pulses to a ground circuit of a computer, the electrostatic discharge protection cover comprising:

an electrostatic discharge protection plate installed on the personal computer card socket and connected to the ground circuit of the computer to lead the electrostatic discharge pulse to the ground circuit; and a metal stair-type enhancing edge connected to the electrostatic discharge protection plate and coupling with a crossbeam of the computer to enhance a bending strength of the electrostatic discharge protection plate, wherein the metal stair-type enhancing edge electrically couples with the crossbeam connecting with the around circuit.

2. The electrostatic discharge protection cover of claim 1, wherein the stair-type enhancing edge is formed by bending the electrostatic discharge protection plate upward about 90 degrees and then forward about 90 degrees.

* * * * *